US008427037B2

(12) United States Patent
Liang et al.

(10) Patent No.: US 8,427,037 B2
(45) Date of Patent: Apr. 23, 2013

(54) LED LUMINAIRE CAPABLE OF INCREASING THE VIEW ANGLE

(75) Inventors: Chih-Lung Liang, Taipei (TW); Shu-Hua Yang, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 32 days.

(21) Appl. No.: 13/158,882

(22) Filed: Jun. 13, 2011

(65) Prior Publication Data

US 2012/0043877 A1 Feb. 23, 2012

Related U.S. Application Data

(60) Provisional application No. 61/375,350, filed on Aug. 20, 2010.

(30) Foreign Application Priority Data

Dec. 2, 2010 (TW) ................................ 99141911 A

(51) Int. Cl.
*H01L 51/52* (2006.01)
*H05B 33/02* (2006.01)
*F21V 3/00* (2006.01)

(52) U.S. Cl.
USPC ....... 313/113; 313/310; 362/800; 362/311.02

(58) Field of Classification Search ............. 362/311.02, 362/555, 349.02, 800, 254, 257; 313/113, 313/110
See application file for complete search history.

(56) References Cited

U.S. PATENT DOCUMENTS

| | | | | |
|---|---|---|---|---|
| 7,229,196 | B2 * | 6/2007 | Hulse | 362/341 |
| 7,628,513 | B2 * | 12/2009 | Chiu | 362/311.02 |
| 7,922,355 | B1 * | 4/2011 | Morejon et al. | 362/247 |
| 2008/0137360 | A1 * | 6/2008 | Van Jijswick et al. | 362/555 |
| 2010/0148650 | A1 * | 6/2010 | Wu et al. | 313/1 |
| 2012/0044692 | A1 * | 2/2012 | Liang et al. | 362/257 |

* cited by examiner

*Primary Examiner* — Joseph L Williams
(74) *Attorney, Agent, or Firm* — Rosenberg, Klein & Lee

(57) ABSTRACT

A luminaire includes a lamp holder, a first light-emitting module, a second light-emitting module, a light guide, and a lamp cover. The lamp holder has a top portion. The top portion includes a first upper face and a platform projecting upwardly from the first upper face. The platform has a second upper face at a top end thereof. The first light-emitting module is disposed on the first upper face and around the platform. The second light-emitting module is disposed on the second upper face. The light guide is disposed around the platform and on the first light-emitting module. The lamp cover is disposed on the lamp holder for covering the first light-emitting module, the second light-emitting module, and the light guide.

20 Claims, 6 Drawing Sheets

LED LUMINAIRE CAPABLE OF INCREASING THE VIEW ANGLE

CROSS-REFERENCE TO RELATED APPLICATION

This application claims priority of U.S. provisional application No. 61/375,350, filed on Aug. 20, 2010, and Taiwanese Application No. 099141911, filed on Dec. 2, 2010.

BACKGROUND OF THE INVENTION

1. Field of the Invention

This invention relates to a luminaire, and more particularly to a luminaire capable of increasing the view angle.

2. Description of the Related Art

Since light-emitting diode (LED) lamps have the advantages of power saving, long usage life, and meeting the requirement for environmental protection, they are used widely for illumination.

In the field of bulbs, however, the most popular are still incandescent bulbs since the view angle of a conventional LED lamp is about only 120°, which is much smaller than that of the incandescent bulbs. For example, when an incandescent bulb is hung on a ceiling to serve as an upwardly directed lamp, illumination can be provided in spaces above and below the incandescent bulb. However, if the upwardly directed incandescent bulb is replaced with an LED lamp, illumination can be provided only above the LED lamp and on the ceiling.

SUMMARY OF THE INVENTION

The object of this invention is to provide a luminaire with an increased view angle.

According to an aspect of this invention, there is provided a luminaire including a lamp holder, a first light-emitting module, a second light-emitting module, a light guide, and a lamp cover. The lamp holder has a top portion. The top portion includes a first upper face and a platform projecting upwardly from the first upper face. The platform has a second upper face at a top end thereof. The first light-emitting module is disposed on the first upper face and around the platform. The second light-emitting module is disposed on the second upper face. The light guide is disposed around the platform and on the first light-emitting module. The lamp cover is disposed on the lamp holder for covering the first light-emitting module, the second light-emitting module, and the light guide.

According to another aspect of this invention, there is provided a luminaire including a lamp holder, a first light-emitting module, a second light-emitting module, a light guide, and a lamp cover. The lamp holder has a top portion and the top portion includes a first upper face and a second upper face. The first upper face is disposed below and around the second upper face. The first light-emitting module is disposed on the first upper face, and the second light-emitting module is disposed on the second upper face. The light guide is disposed on the first light-emitting module and around the second upper face. The lamp cover is disposed on the lamp holder for covering the first light-emitting module, the second light-emitting module, and the light guide.

The luminaire of this invention has an effect in that, since light emitted from the first light-emitting module to be refracted and reflected is transmitted out of the luminaire through the light guide in a lateral direction, the view angle of the lamp is increased. Furthermore, since the first upper face is below the second upper face, lateral light emitted from the second light-emitting module cannot be obstructed by the first light-emitting module and the first upper face, the amount of the lateral light can be increased. Hence, the view angle of the lamp can be further increased.

BRIEF DESCRIPTION OF THE DRAWINGS

These and other features and advantages of this invention will become apparent in the following detailed description of three preferred embodiments of this invention, with reference to the accompanying drawings, in which.

DETAILED DESCRIPTION OF THE PREFERRED EMBODIMENTS

Figure 1:
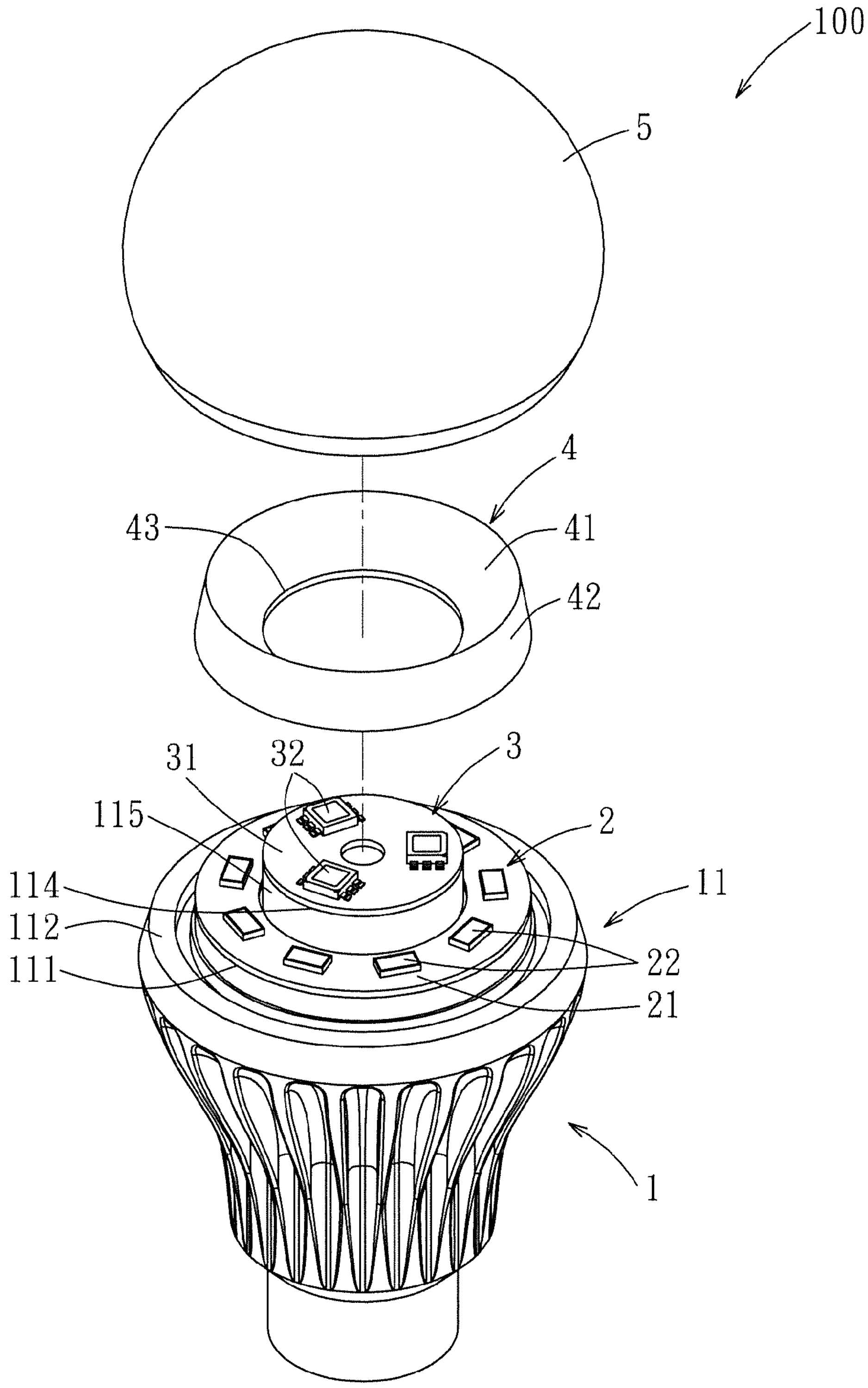
FIG. 1 is a partly exploded perspective view of the first preferred embodiment of a luminaire according to this invention.

Before the present invention is described in greater detail in connection with the preferred embodiments, it should be noted that similar elements and structures are designated by like reference numerals throughout the entire disclosure.

Figure 2:
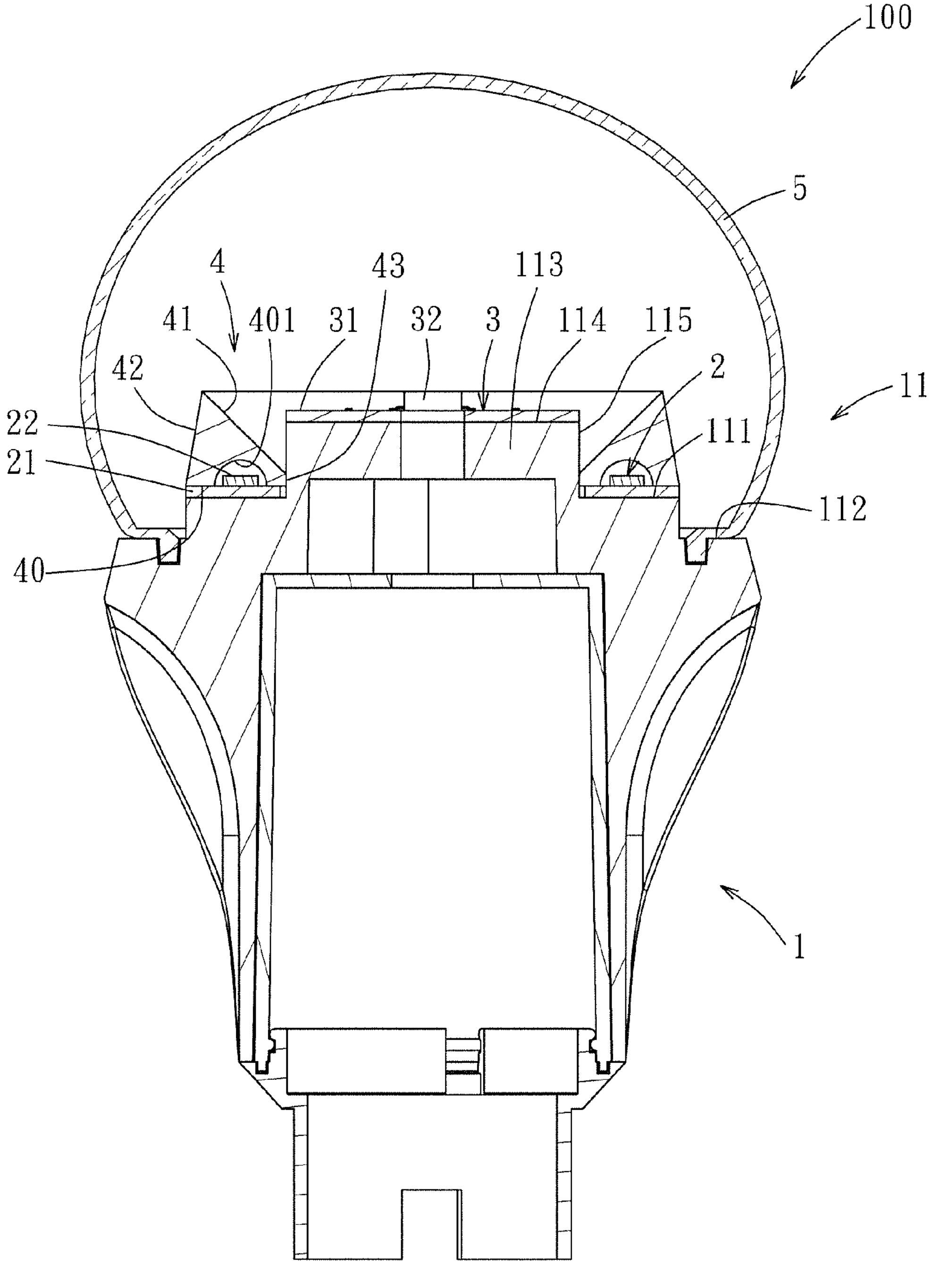
FIG. 2 is a sectional view of the first preferred embodiment.
Figure 3:
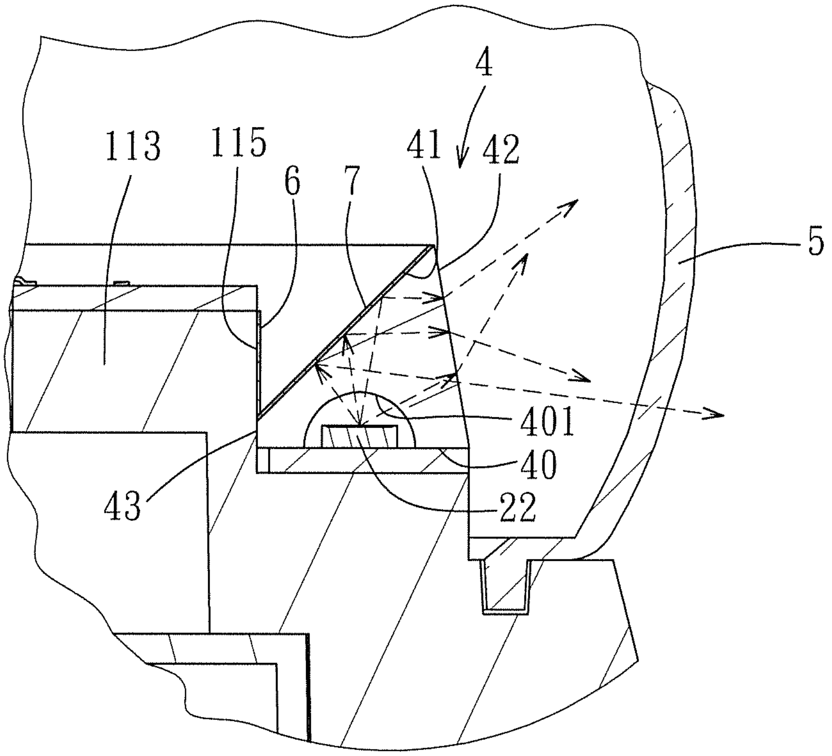
FIG. 3 is a fragmentary sectional view of the first preferred embodiment, illustrating refraction and reflection of light in a light guide when emitted from a first LED.

Referring to FIGS. 1 and 2, the first preferred embodiment of a luminaire according to this invention includes a lamp holder 1, a first light-emitting module 2, a second light-emitting module 3, a light guide 4, and a lamp cover 5.

The lamp holder 11 has a top portion 11. The top portion includes a first upper face 111, a platform 113 projecting upwardly from the first upper face 111 and having a second upper face 114 at a top end thereof, and a third upper face 112 disposed below and around the first upper face 111. The first upper face 111 cooperates with the platform 113 and the third upper face 112 to constitute a three-stepped structure at the top portion 11 of the lamp holder 1. The platform 113 is cylindrical, and further has an annular peripheral surface 115 extending downwardly from a periphery of the second upper face 114 and coated with a first reflecting layer 6. The first upper face 111 is horizontal, and is perpendicular to the peripheral surface 115 of the platform 113.

The first light-emitting module 2 includes a first circuit board 21 disposed on the first upper face 111 of the lamp holder 1 and around the platform 113, and a plurality of first LEDs 22 disposed on the first circuit board 21. The second light-emitting module 3 includes a second circuit board 31 disposed on the second upper face 114 of the platform 113, and a plurality of second LEDs 32 disposed on the second circuit board 31. A driving circuit (not shown) is disposed within the lamp holder 1 for driving the first and second light-emitting modules 2, 3. The lamp cover 5 is disposed on the third upper face 112 for covering the first and second light-emitting modules 2, 3.

The light guide 4 is configured as a ring, and is disposed above the first light-emitting module 2. In other words, the light guide 4 is disposed around the platform 113 for covering the first LEDs 22. The light guide 4 includes a bottom surface 40, a first side surface 41 connected to the bottom surface 40 and proximate to the platform 113, a second side surface 42 connected between the bottom surface 40 and the first side surface 41 and distal from the platform 113, and a third side surface 43 connected between the first side surface 41 and the bottom surface 40 and disposed around the platform 113. That is, the first and third side surfaces 41, 43 face toward the platform 113, the second side surface 42 faces away from the platform 113, and the third side surface 43 is parallel to and abuts against the peripheral surface 115 of the platform 113.

The second side surface 42 is inclined, and forms an angle of about 90 degrees with respect to the bottom surface 40, preferably between 80 and 90 degrees. That is to say, the second side surface 42 is approximately perpendicular to the bottom surface 40. The first side surface 41 is also inclined, and forms an acute angle with respect to the second side surface 42, which is smaller than the angle between the second side surface 42 and the bottom surface 40. In this embodiment, the acute angle is about 45 degrees. In practice, since the length of the third side surface 43 is much less than that of each of the bottom surface 40, the first side surface 41, and the second side surface 42, the third side surface 43 may be omitted from the light guide 4, such that a lower end of the first side surface 41 is connected directly to the bottom surface 40, so that the light guide 4 is generally triangular in cross-section. The first side surface 41 is coated with a second reflecting layer 7 for promoting the light-reflecting effect. In this embodiment, the second reflecting layer 7 is a white paint, which has a reflection rate of about 70%. The bottom surface 40 has an upwardly concaved curved surface portion 401 that is semicircular in cross-section for covering the first LEDs 22 on the circuit board 21. In this embodiment, the curved surface portion 401 defines an annular groove in the bottom surface 40, such that a majority of light beams enter into the curved surface portion 401 (i.e. an incidence plane of the light guide 4) in normal line directions to avoid reflection. In other embodiments, the curved surface portion 401 may have a plurality of semi-spherical curved surface sections defining respectively a plurality of semi-spherical concavities in the bottom surface 40 for receiving the first LEDs 22, respectively. As such, each light beam emitted from the first LEDs 22 can enter into the curved surface portion 401 in a normal line direction to prevent any light reflection.

When light is emitted from the first LEDs 22 into the light guide 4 via the bottom surface 40 to reach the first side surface 41, a majority (about 70%) of the light is reflected from the first side surface 41 and out of the light guide 4 via the second side surface 42. The remainder of the light (about 30%) passes through the first side surface 41, and is reflected from the first reflecting layer 6 on the peripheral surface 114 of the platform 113. Consequently, the amount of light obstructed by the platform 113 is reduced, so that the amount of light transmitted out of the luminaire 100 in the lateral direction is increased. In this embodiment, the first reflecting layer 6 is a reflective plate having a reflection rate 97%. Since the third upper face 112 is below the first upper face 111, light transmitted out of the light guide 4 via the second side surface 42 cannot be obstructed by the third upper face 112, thereby increasing the view angle of the luminaire 100 to about 153 degrees.

It should be noted that, when the luminous flux emitted upwardly from the luminaire 100 is approximate to that emitted laterally from the luminaire 100, the light emitting effect of the luminaire 100 is optimal, and the hotspot condition of the luminaire 100 is diminished. In this embodiment, although the number of the second LEDs 32 is less than that of the first LEDs 22, the lumen number of each of the second LEDs 32 is higher than that of each of the first LEDs 22, such that the total lumen number of the second LEDs 32 is approximate to that of the first LEDs 22, so that the hotspot condition can be diminished. Preferably, the second side surface 42 has a microstructure (not shown), which is obtained by a texture treatment for preventing total reflection of light at the second side surface 42 when transmitted toward the second side surface 42, so as to enhance the light emitting efficiency. Preferably, the light guide 4 has a vertical thickness that is equal to the height difference of the first and second upper faces 111, 114 minus the vertical thickness of the first circuit 21 and plus the total vertical thickness of the second circuit board 31 and one of the second LEDs 32. That is, a top end of the light guide 4 and top surfaces of second LEDs 32 are at the same level. The vertical thickness of the light guide 4 may be increased by a thickness value that is preferably not more than three times the vertical thickness of one of the second LEDs 32. It should be noted that, when the height of the light guide 4 is between one third and one half of the height of the lamp cover 5 relative to the third upper face 112 (i.e., the distance between a top end of the lamp cover 5 and the third upper face 112), a better light emitting effect can be obtained. Preferably, the distance between the first and third upper faces 111, 112 is more than 3 mm, so as to provide a better light emitting effect.

Figure 4:
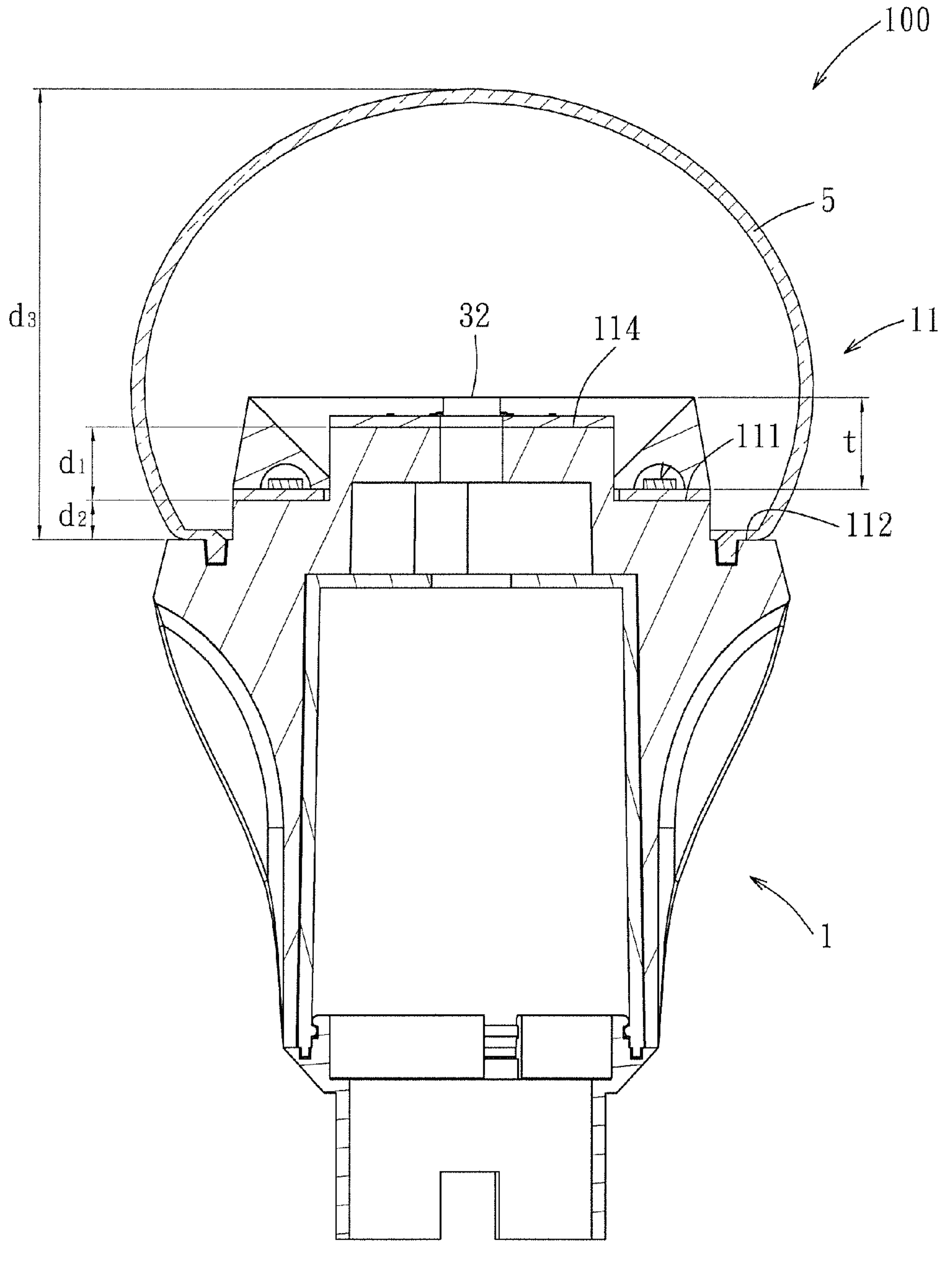
FIG. 4 is a schematic sectional view of the first preferred embodiment, illustrating some dimensions.

With further reference to FIG. 4, the first and second upper faces 111, 114 are spaced apart from each other by a first height difference (d1), the first and third upper faces 111, 112 are spaced apart from each other by a second height difference (d2), the top end of the lamp cover 5 is spaced apart from the third upper face 112 by a third height difference (d3) (i.e., the height of the lamp cover 5 relative to the third upper face 112). In this embodiment, the first height difference (d1) is 5.5 mm, the second height difference (d2) is 3.5 mm, the third height difference (d3) is 40 mm, and the vertical thickness (t) of the light guide 4 is 8.14 mm.

As such, the first upper face 111 is below the second upper face 114, and the first light-emitting module 2 is disposed on the first upper face 111 and is covered by the light guide 4, as described above, such that the first light-emitting module 2 cooperates with the second light-emitting module 3 to emit light to thereby increase the view angle. Furthermore, due to the guidance of the light guide 4, light emitted by the first light-emitting module 2 is transmitted out of the luminaire 100 in the lateral direction, so as not to interfere with upward light emitted upwardly from the second LEDs 32. Since light emitted from the second light-emitting module 3 does not pass through any additional optical structure, and is not interfered with that emitted from the first light-emitting module 2, upward light emitting efficiency can be ensured. Furthermore, due to the cooperation of the light guide 4 and the first light-emitting module 2, the amount of lateral light emitted from the luminaire 100 and the view angle can be increased significantly without affecting adversely uniformity of light emitted from the luminaire 100.

Figure 5:
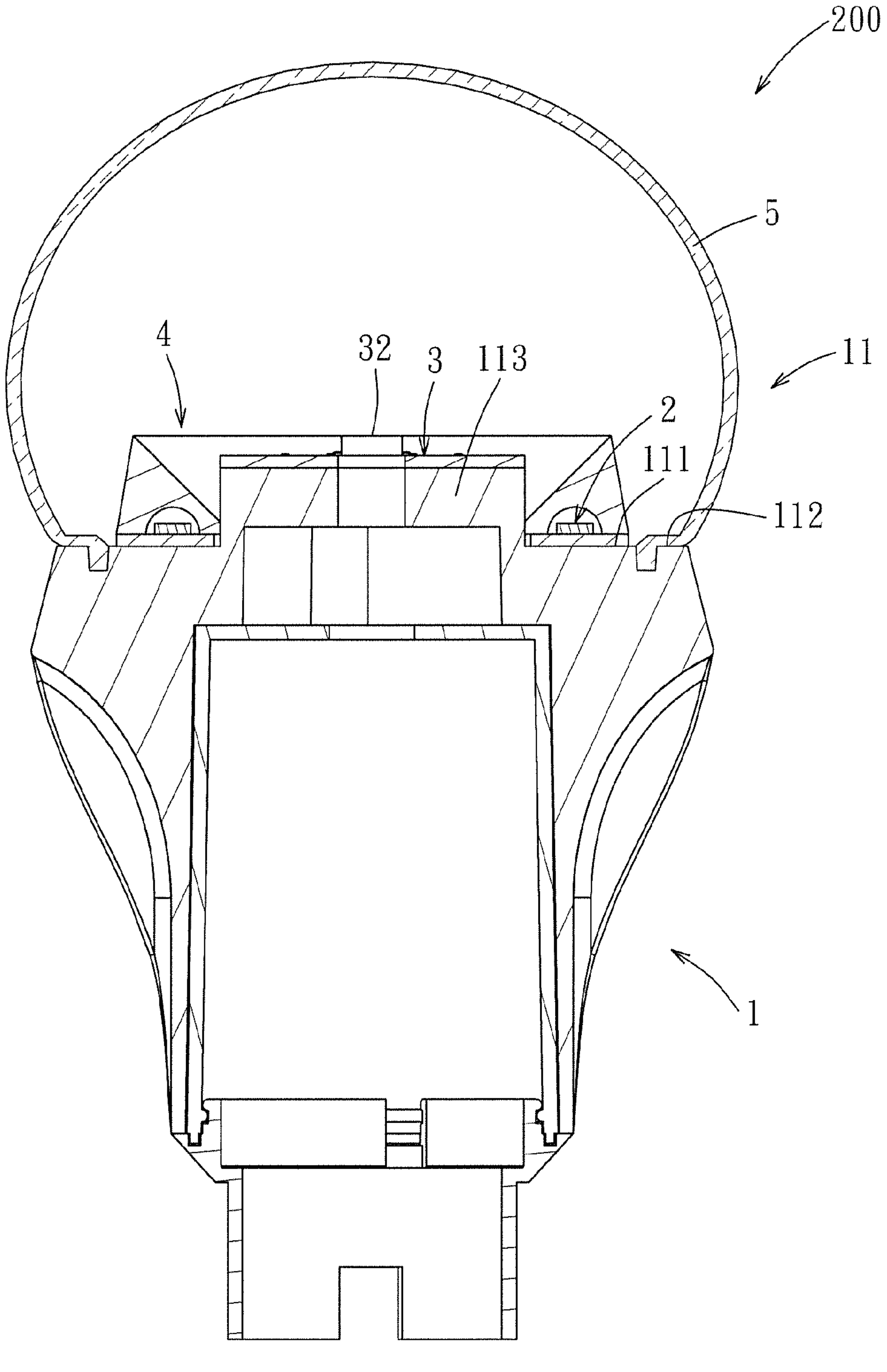
FIG. 5 is a sectional view of the second preferred embodiment of a luminaire according to this invention.

FIG. 5 shows the second preferred embodiment of a luminaire 200 according to this invention, which differs from the first preferred embodiment in that the first and third upper faces 111, 112 of the top portion 11 of the lamp holder 1 are at the same level. In other words, the top portion 11 of the lamp holder 1 has a two-stepped structure formed by the first upper face 111 and the platform 113. In this embodiment, the second reflecting layer 7 is a white paint (the reflection rate thereof is about 70%), and the view angle of the luminaire 200 is 140 degrees. If the white paint constituting the second reflecting layer 7 is replaced with a reflective plate (the reflection rate thereof is about 97%), the view angle of the luminaire 200 can be increased to about 150 degrees.

Figure 6:
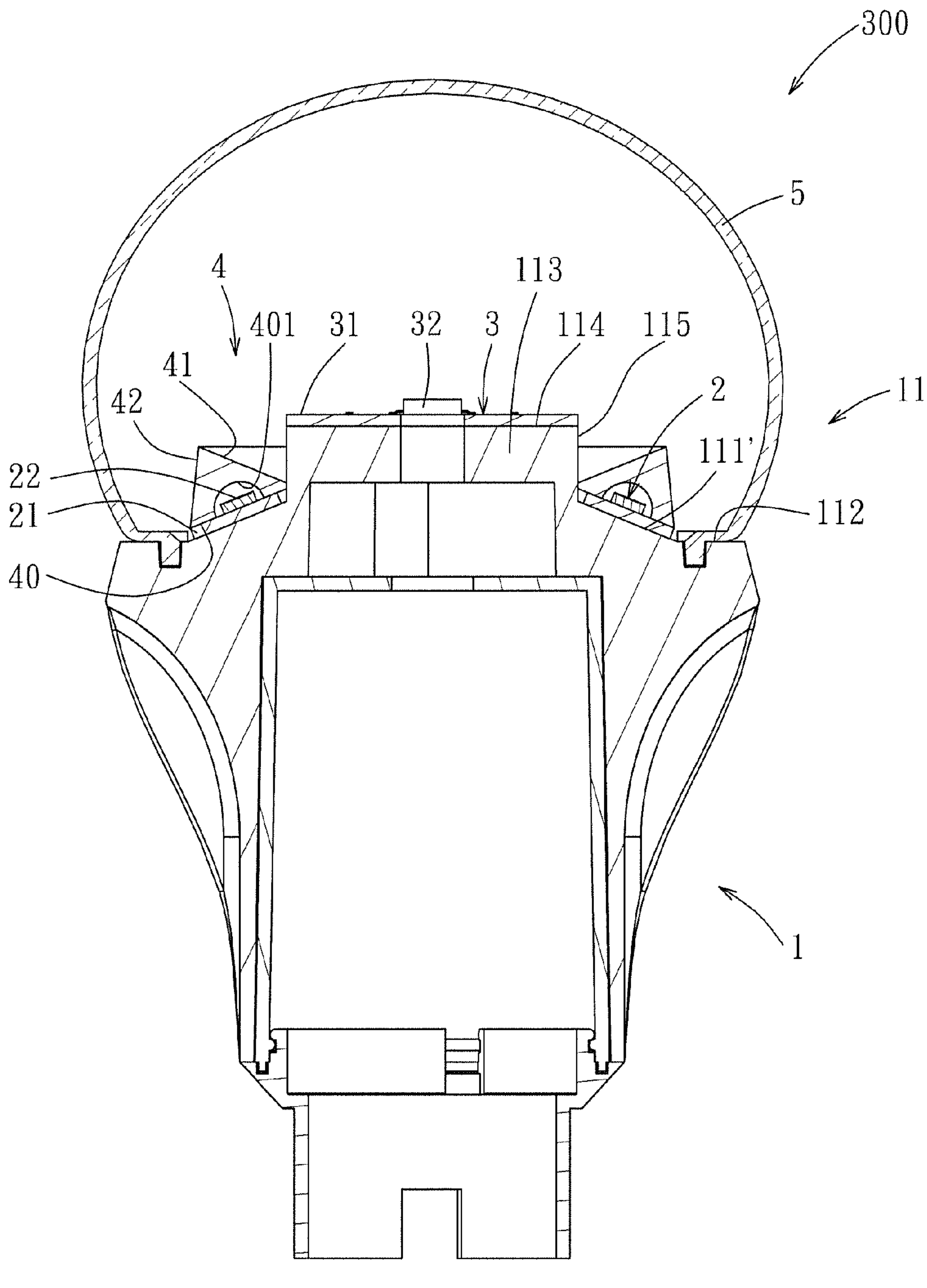
FIG. 6 is a sectional view of the third preferred embodiment of a luminaire according to this invention.

FIG. 6 shows the third preferred embodiment of a luminaire 300, which differs from the first preferred embodiment in that the first upper face 111' is inclined (in the first preferred embodiment, the first upper face 111 is horizontal). In this embodiment, an obtuse angle is formed between the peripheral surface 115 and the first upper face 111', such that the first upper face 111' extends downwardly and outwardly from a lower end of the peripheral surface 115. Since positions of the first light-emitting module 2 and the light guide 4 relative to the first upper face 111' are the same as those of the first preferred embodiment, the amount of lateral light emitted from the first light-emitting module 2 and the view angle of luminaire 300 can be increased considerably. Furthermore, since the first upper face 111' is inclined, the view angle can be increased even if the third upper face 112 is omitted.

In view of the above, the second light-emitting module 3 can emit upward light, and the first light-emitting module 2 can emit lateral light due to the guidance of the light guide 4, so that the view angle of the luminaires 100, 200, 300 can be promoted effectively. Furthermore, due to the presence of a stepped structure formed by the first and second upper faces 111, 114, lateral light emitted from the second light-emitting module 3 cannot be obstructed by the first light-emitting module 2 and the first upper face 111. Alternatively, the first upper face 111' is inclined to thereby increase the amount of the lateral light emitted out. Thus, the view angle of the luminaire 100, 200, 300 is increased.

With this invention thus explained, it is apparent that numerous modifications and variations can be made without departing from the scope and spirit of this invention. It is therefore intended that this invention be limited only as indicated by the appended claims.

We claim:

1. A luminaire comprising:
- a lamp holder having a top portion, said top portion including a first upper face and a platform projecting upwardly from said first upper face, said platform having a second upper face at a top end thereof;
- a first light-emitting module disposed on said first upper face and around said platform;
- a second light-emitting module disposed on said second upper face;
- a light guide disposed around said platform and on said first light-emitting module; and
- a lamp cover disposed on said lamp holder for covering said first light-emitting module, said second light-emitting module, and said light guide.

2. The luminaire as claimed in claim 1, wherein said light guide has a bottom surface, a first side surface facing toward said platform, and a second side surface connected between said bottom surface and said first side surface and facing away from said platform, said first side surface cooperating with said second side surface to form an acute angle therebetween.

3. The luminaire as claimed in claim 2, wherein said light guide is generally triangular in cross-section.

4. The luminaire as claimed in claim 2, wherein said second side surface has a microstructure.

5. The luminaire as claimed in claim 2, wherein said acute angle is 45 degrees.

6. The luminaire as claimed in claim 2, wherein said second side surface is approximately perpendicular to said bottom surface.

7. The luminaire as claimed in claim 2, wherein said light guide further has a third side surface interconnecting said bottom surface and said first side surface.

8. The luminaire as claimed in claim 7, wherein said platform further has a peripheral surface extending downwardly from said second upper face.

9. The luminaire as claimed in claim 8, further comprising a first reflecting layer that is disposed on said peripheral surface.

10. The luminaire as claimed in claim 9, wherein said first reflecting layer is a reflective plate.

11. The luminaire as claimed in claim 9, further comprising a second reflecting layer disposed on said first side surface of said light guide and being one of a white paint and a reflective plate.

12. The luminaire as claimed in claim 7, wherein said third side surface is parallel to and abuts against said peripheral surface of said platform.

13. The luminaire as claimed in claim 1, wherein said platform further has a peripheral surface extending downwardly from said second upper face.

14. The luminaire as claimed in claim 1, wherein said first light-emitting module and said second light-emitting module have the same luminous flux.

15. The luminaire as claimed in claim 1, wherein said top portion further includes a third upper face disposed below and around said first upper face.

16. The luminaire as claimed in claim 1, wherein said light guide has a vertical thickness that is between one third and one half of a height of said lamp cover.

17. The luminaire as claimed in claim 1, wherein said first light-emitting module includes a first circuit board, and a plurality of first LEDs disposed on said first circuit board, said light guide having a bottom surface, said bottom surface having an upwardly concaved curved surface portion for covering said first LEDs.

18. The luminaire as claimed in claim 10, wherein said first upper face is horizontal, and a top end of said light guide and top ends of said second LEDs are at the same level.

19. A luminaire comprising:
- a lamp holder having a top portion, said top portion including a first upper face and a second upper face, wherein said first upper face is disposed below and around the second upper face;
- a first light-emitting module disposed on said first upper face;
- a second light-emitting module disposed on said second upper face;
- a light guide disposed on said first light-emitting module and around said second upper face; and
- a lamp cover disposed on said lamp holder for covering said first light-emitting module, said second light-emitting module, and said light guide.

20. The luminaire as claimed in claim 19, wherein said first and second upper faces constitute a stepped structure, and said top portion includes a platform having said second upper face and projecting upwardly from said first upper face.

* * * * *